United States Patent [19]
Makino

[11] 4,013,898
[45] Mar. 22, 1977

[54] HYSTERESIS CIRCUIT

[75] Inventor: Shinichi Makino, Fujisawa, Japan

[73] Assignee: Tokyo Shibaura Electric Co., Ltd., Japan

[22] Filed: Jan. 14, 1976

[21] Appl. No.: 649,042

[30] Foreign Application Priority Data

Jan. 17, 1975  Japan .............................. 50-7088

[52] U.S. Cl. ..................... 307/235 F; 307/235 T; 307/290; 307/299 B; 330/30 D
[51] Int. Cl.² ..................................... H03K 5/20
[58] Field of Search ....... 307/235 F, 235 N, 235 T, 307/290, 299 B, 313; 330/30 D

[56] References Cited
UNITED STATES PATENTS 3,848,139  11/1974  Holt .............................. 307/235 F Primary Examiner—James B. Mullins
Attorney, Agent, or Firm—Oblon, Fisher, Spivak, McClelland & Maier

[57] ABSTRACT

A differential amplifier including first and second transistors is provided. A first input terminal is connected via a resistor to the base of the first transistor, a second input terminal is connected to the base of the second transistor, and the emitters of the first and second transistors are connected to one terminal of a first current source. A current mirror circuit including third and fourth transistors of the complementary type to the first and second transistors is connected between the collector of the second transistor and one terminal of a second current source which has a current capacity substantially half that of the first current source. The other terminals of the first and second current sources ar connected together and a fifth transistor of the same type as the third and fourth transistors is connected between the collector of the first transistor and a power source terminal and the base of the fifth transistor is connected to the one terminal of the second current source.

5 Claims, 5 Drawing Figures $V_t = \frac{R2}{R1+R2} V_{OUT}$

HYSTERESIS CIRCUIT

BACKGROUND OF THE INVENTION

1. Field of the Invention

This invention relates to a hysteresis circuit, and more particularly, to a hysteresis circuit having a wide hysteresis range and a stable zero cross level.

2. Description of the Prior Art

In the past, circuits using direct current amplifiers and Schmidt trigger circuits have been widely used as hysteresis circuits. In a hysteresis circuit using a direct current amplifier, as shown in FIG. 1(a), an input voltage $V_{in}$ is supplied to the inversion output terminal of a direct current amplifier 1 whose output voltage is divided by resistors R1 and R2. The divided voltage is supplied to the non-inversion input terminal of the amplifier 1.

FIG. 1(b) shows the relationship between the input voltage and the output voltage of the circuit of FIG. 1(a). In this input and output voltage characteristic diagram, the threshold voltage $V_t$ is expressed by the following equation:

$$V_t = \frac{R2}{R1 + R2} \cdot V_{out}$$

where $V_{out}$ is the output voltage of the circuit and R1 and R2 are the values of the resistances used for voltage splitting.

From the above equation, it is clear that in order to change the hysteresis range, R1 or R2 or the output voltage $V_{out}$ may be changed. In this case, the method of changing the value of a resistance is generally adopted. However the threshold voltage $V_t$ is proportioned to $$\frac{R2}{R1+R2} = \frac{1}{1+\frac{R1}{R2}}$$

and, therefore, if R1 or R2 is changed linearly, the hysteresis range is changed non-linearly. Expressing this conversely, if it is desired to change the hysteresis range linearly, then R1 or R2 must be changed non-linearly.

Accordingly, if the change in the resistance value is to be made electronically, the electronic circuit for this purpose becomes rather complicated. This becomes a great disadvantage in cases where the circuit is of integrated construction.

On the other hand, a Schmidt trigger circuit is well known as a circuit having a hysteresis characteristic. FIG. 2 shows a typical Schmidt trigger circuit which includes a transistor Q1 and a transistor Q2. In this circuit, the emitters of the transistors Q1 and Q2 are connected together and to ground via a resistor R1, and the collector of the transistor Q1 is connected to the base of the transistor Q2 via a resistor R2. The base of the transistor Q2 is also connected to ground via a resistor R3. Each of the collectors of the two transistors is connected to a control voltage input terminal $V_{cc}$ via respective resistors R4 and R5. The input voltage is applied to the base of the transistor Q1. The output voltage is taken from the collector of the transistor Q2.

In this circuit, if the value of the voltage applied to the base of the transistor Q1 is below a threshold value voltage, then the transistor Q2 will be on, and, if the value of the voltage applied to the base of Q1 is above the threshold value voltage, then the transistor Q2 will be off. Thus, the arrangement is such that an output voltage is obtained only if the input voltage is above the threshold value. By making the loop gain of this circuit greater than 1, it is possible to give the circuit a hysteresis characteristic. However, it is well known that it is generally impossible to vary the loop gain of such a circuit over a wide range. Accordingly, this circuit is not suitable for employment in cases where positive use is made of its hysteresis characteristic.

The two known techniques described above both have the disadvantage that the zero cross level is unstable. That is to say, in the circuit shown in FIG. 1(a), the zero cross level is made unstable by the temperature characteristics of the transistor constituting the direct current amplifier. Likewise, in the circuit shown in FIG. 2, the threshold values of the transistors Q1 and Q2 have temperature characteristics and therefore the zero cross level becomes unstable.

SUMMARY OF THE INVENTION

Accordingly, it is an object of the present invention to provide a new and improved hysteresis circuit in which it is possible to obtain a wide and variable hysteresis range and a stable zero cross level.

Another object of the present invention is to provide a new and improved hysteresis circuit which is small and is easily controlled.

The foregoing and other objects are attained in accordance with one aspect of the present invention through the provision of a hysteresis circuit comprising a differential amplifier including first and second transistors, a first input terminal connected via a resistor to the base of the first transistor, a second input terminal connected to the base of the second transistor, the emitters of the first and second transistors being connected to one terminal of a first current source, a current mirror circuit including third and fourth transistors of a complementary type to the first and second transistors connected between the collector of the second transistor and one terminal of a second current source which has a current capacity substantially half that of the first current source, the other terminals of the first and second current sources being connected together, and a fifth transistor of the same type as the third and fourth transistors connected between the collector of the first transistor and a power source terminal with the base of the fifth transistor being connected to the one terminal of the second current source.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENTS

Figure 1A:
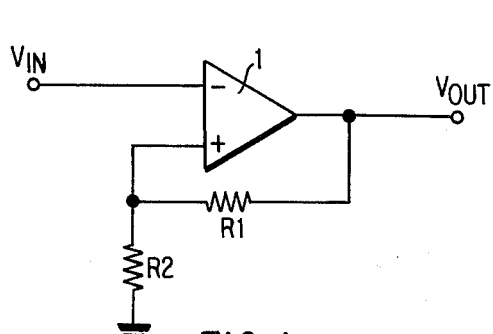
FIG. 1(a) is a structural diagram of a known hysteresis circuit using a direct current amplifier.
Figure 1B:
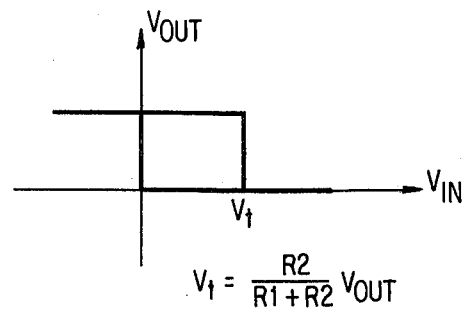
FIG. 1(b) is a diagram showing the input and output characteristics of the circuit of FIG. 1(a)
Figure 3:
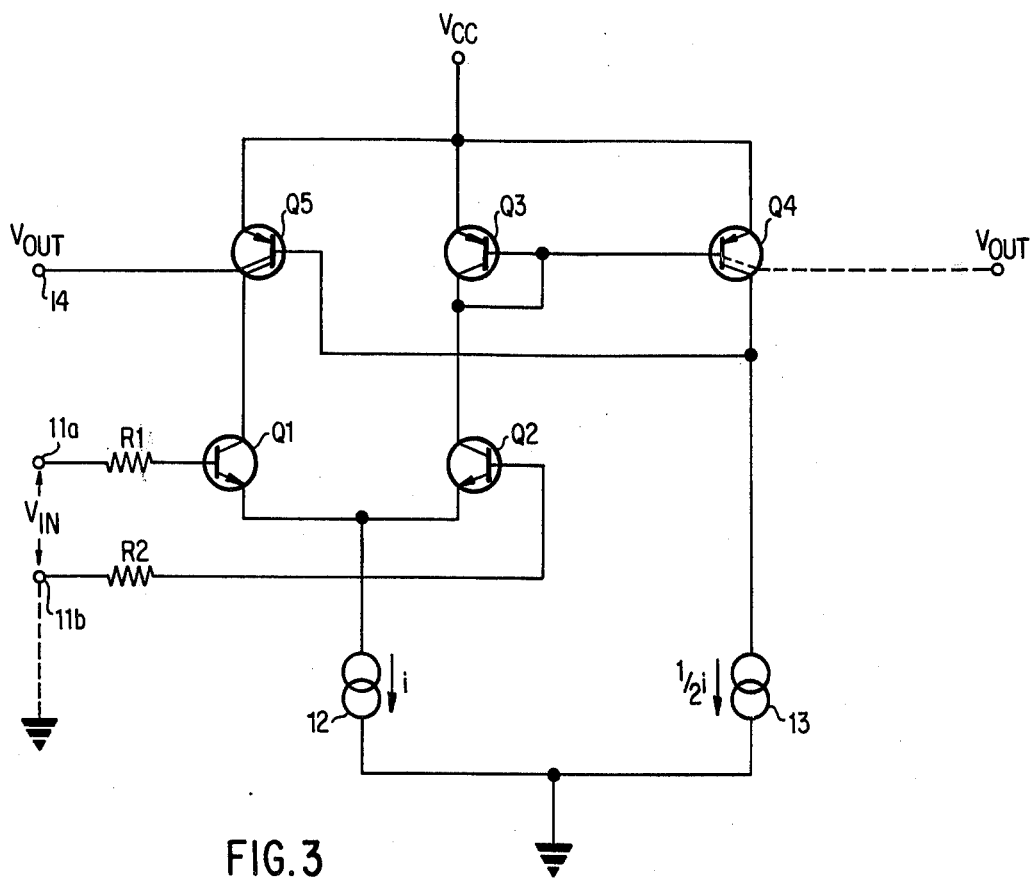
FIG. 3 is a circuit diagram showing a hysteresis circuit according to the present invention.
Figure 2:
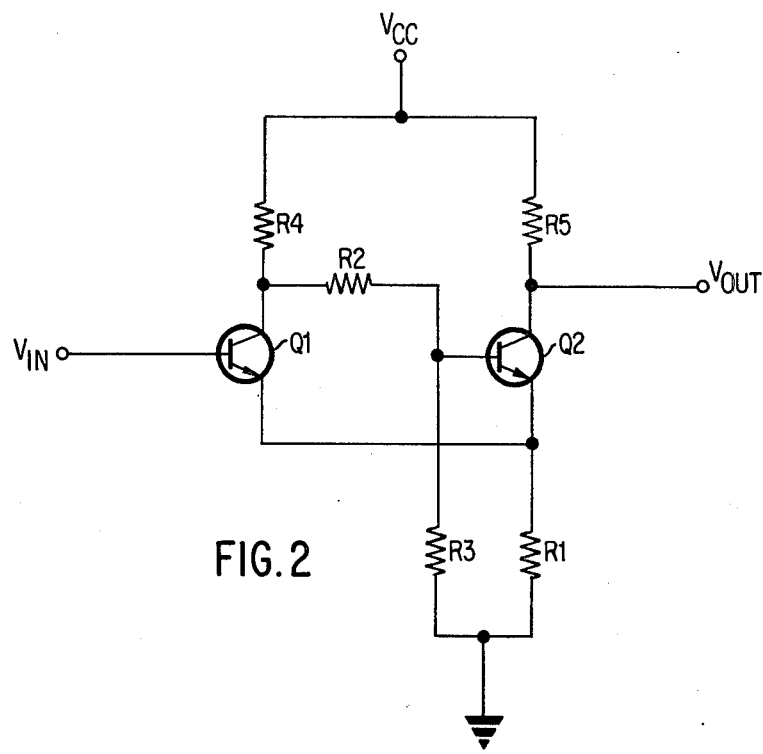
FIG. 2 is a circuit diagram of another known circuit having a hysteresis characteristic.

Referring now to the drawings, wherein like reference numerals designate identical or corresponding parts throughout the several views, and more particularly to FIG. 3 thereof, the preferred embodiment of the present invention is diagrammatically illustrated in FIG. 3. In FIG. 3, an input voltage $V_{in}$ is applied between terminals 11a and 11b. R1 and R2 are input resistors which are connected to the bases of npn transistors Q1, Q2 respectively. The transistors Q1 and Q2 constitute a differential amplifier. A diode-connected pnp transistor Q3 is connected between the collector of the transistor Q2 and a power source $V_{cc}$. A current mirror circuit is formed by transistor Q3 and a pnp transistor Q4 having a common base connection with transistor Q3. Also, another pnp transistor Q5 is connected between the collector of the transistor Q1 and the power source $V_{cc}$. The base of the transistor Q5 is connected to the collector of the transistor Q4. Moreover, a current source 12 having a current capacity i is connected to the emitters of the transistors Q1 and Q2 and a current source 13 having a current capacity ½i is connected to the collector of the transistor Q4. These current sources 12 and 13 are easily produced by known techniques.

In this circuit, when an input voltage $V_{in}$ is applied between the terminals 11a and 11b so that the potential of terminal 11a becomes very low as compared with the terminal 11b of the transistors Q1 and Q2 constituting the differential amplifier, the transistor Q2 goes into the "on" state and the emitter current i flows through the transistor Q2. This current i is equal to the current flowing in the diode-connected transistor Q3. When the transistor Q2 is thus on so that a current i flows in the transistor Q3, the same amount of current tends to flow in the other transistor Q4 forming the current mirror circuit. However, the current absorbing capacity of the current source 13 is only ½i and, therefore, the transistor Q4 goes into a saturated state and the collector voltage of the transistor Q4 becomes approximately $V_{cc}$. In the state in which the collector voltage of the transistor Q4 becomes approximately $V_{cc}$, the transistor Q5 is off, the transistor Q1 is also off, and therefore the collector potentials of the two transistors Q5 and Q1 become variable.

If, at this time, the voltage of the input terminal 11a gradually rises, the circuit of the present invention performs the action described hereunder. This will now be described with reference to FIG. 4 in which reference numeral 21a shows the voltage supplied to the input terminal 11a, reference numeral 21b shows the voltage supplied to the input terminal 11b and the broken line 22 shows the base voltage of the transistor Q1.

When the voltage applied to the input terminal 11a rises, a base current can flow in the transistor Q1. But, at this time, the transistor Q5 is off. Therefore, the collector current of the transistor Q1 does not flow and all the current is supplied from the base. On the other hand, the emitter current of the transistor Q2, which is in the "on" state, decreases as the base current of the transistor Q1 increases.

Now, when the currents flowing through the emitters of the transistor Q1 and the transistor Q2 both become ½i, the current flowing through the transistor Q3 also becomes ½i.

Figure 4:
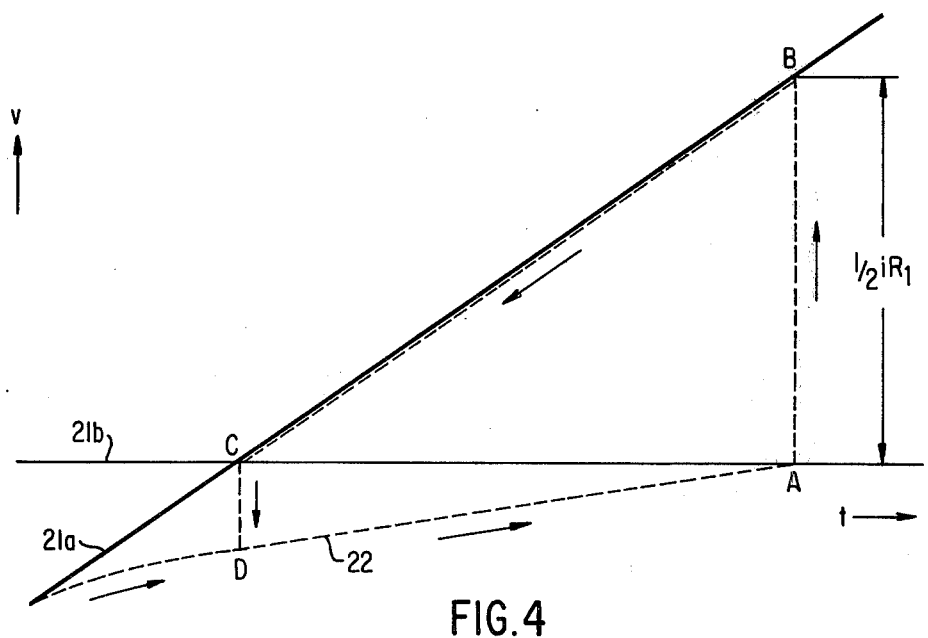
FIG. 4 is a diagram to illustrate the operation of the hysteresis circuit of FIG. 3.

Accordingly, a current ½i flows in the transistor Q4 also and this is equal to the absorption current of the current source 13. Also, the emitter currents of the transistors Q1 and Q2 are equal. Therefore, the base potentials of the two transistors are equal. That is to say, the point A in FIG. 4 shows this state. At this time, a current ½i is flowing in the resistor R1 connected to the base of the transistor Q1. Therefore, the voltage drop due to this resistor R1 becomes ½iR1 and the input terminal 11a will be at a potential which is higher by ½iR1 than the input terminal 11b.

When the voltage applied to the input terminal 11a becomes slightly greater than the voltage corresponding to this state, the emitter current of the transistor Q2 again decreases only slightly. The current of the transistor Q4 decreases together with this, and, therefore, the current source 13 can draw current from the base of the transistor Q5. As a result, a base current flows in the transistor Q5 which ceases to be off and begins to conduct. Now, as the transistor Q5 changes to the "on" state, the collector current of transistor Q5 increases, and, to the same extent, the emitter current of the transistor Q1 increases, and the base current distribution ratio decreases. When the emitter current of the transistor Q1 increases, the emitter current of the transistor Q2 decreases by the same amount, and the collector currents of the transistors Q3 and Q4 also decrease. Therefore, the base current of the transistor Q5 increases more and more so that the collector current of transistor Q5 increases and the base potential of the transistor Q1 rises more and more. Thus, after the emitter currents of the transistors Q1 and Q2 have both become ½i, what is known as positive feedback is applied to the circuit, and the base potential of the transistor Q1, which has hitherto been at point A, abruptly shifts to the point B, (see FIG. 4). When this happens, the emitter current of the transistor Q1 becomes approximately i and practically no current flows in the transistor Q2. Therefore, hardly any current flows in the transistor Q3 or in Q4, which forms the current mirror circuit. Now, a current which is approximately ½i flows in the base of the transistor Q5, and the transistor Q5 goes into the saturated state and its collector potential becomes approximately $V_{cc}$.

Next, when the input voltage applied to the input terminal 11a gradually decreases, the emitter current of the transistor Q1 gradually decreases whereas current begins to flow in the transistor Q2. When this happens, the transistors Q1 and Q2 operate as an ordinary differential amplifier, and the base voltage of the transistor Q1 decreases until the voltage of the input terminal 11a and the voltage of the input terminal 11b reach the same value and the point C in FIG. 4 is reached. At the point C, the collector currents (or the emitter currents) of the transistor Q1 and the transistor Q2 are approximately equal. Therefore, the current of the transistor Q3 and Q4, which constitute the current mirror circuit, also becomes approximately ½i and becomes approximately equal to the absorption current of the current source 13.

When the voltage applied to the input terminal 11a becomes slightly lower than this, the emitter current of the transistor Q5 decreases in flow. When the base current of the transistor Q5 ceases, the transistor Q5 cannot cause collector current to flow and the emitter current of the transistor Q1 is supplied from its base. As a result, a voltage drop is produced by the resistor R1 so that the base voltage decreases. Therefore, the emitter current of the transistor Q2 increases more and more and the transistor Q5 shifts more and more into the "off" state. In this way, positive feedback is applied so that the base voltage of the transistor Q1 changes abruptly from the point C to the point D as shown in FIG. 4.

Thus, the base voltage of the transistor Q1 shifts along the broken line in FIG. 4 in the direction shown by the arrows.

In FIG. 4, the amount of the change from the point A to the point B in the hysteresis loop is ½iR1 as described previously. Accordingly, in the present invention, the width of the hysteresis range is determined by ½iR1. That is to say, in the present invention, if, for instance, the amount of current $i$ of the current source is made constant, then it is possible to change the hysteresis range by changing R1 or, if R1 is made constant, then it is alternatively possible to change the range by changing the current value $i$.

In the hysteresis circuit of FIG. 3, for example, the collector of the transistor Q4 may be a multicollector and one part of this may be an output terminal as shown by a broken line in FIG. 3. Also, as shown in FIG. 3, one part of a multicollector of the transistor Q5 may be an output terminal 14.

As described above, in the hysteresis circuit of FIG. 3, the hysteresis loop is determined by ½iR1 and, therefore, it is possible to control this by changing the current value without changing the resistance value. As regards the amount of change by means of this current value, usually, it is easily possible to make a change from 10μA to about 3mA, and, therefore, a hysteresis range more than 100 times greater can be obtained. Moreover, in cases in which the current value is kept constant and the resistance value is changed, the only resistance which concerns the change in the hysteresis range is R1, and, therefore, by changing R1 linearly, it is possible to change the hysteresis range linearly. Moreover, only the change in R1 need be controlled and, therefore, the control circuit becomes extremely simple.

Also, the lower limit of the common mode of the hysteresis circuit of the present invention is as far as the range of use (about 0.3 V + $V_{BE}$) of the power source and the upper limit is the voltage obtained when $V_{BE}$ is subtracted from the power source voltage $V_{cc}$. Therefore, the range can be made extremely wide.

Moreover, when the circuit of FIG. 3 is used, only a comparatively small number of elements are required. Therefore, this circuit is suitable for integrated construction and, if resistances are used as the current sources, the currents for determining the hysteresis loop of FIG. 3 can be obtained entirely within an integrated circuit. Furthermore, the voltages applied to the resistances used as the abovementioned current sources can be controlled from outside the integrated circuit so as to control the hysteresis loop. Accordingly, it is possible to produce a hysteresis circuit which is small and also is easily controlled.

Moreover, in the circuit of FIG. 3, if the voltage applied to the terminal 11b is made zero (ground potential) as shown by a broken line in FIG. 3, a stable zero cross level is obtained as is clear from FIG. 4.

Although, in the embodiment described above in relation to FIGS. 3 and 4, the transistors Q1 and Q2 are shown as npn transistors and the transistors Q3, Q4 and Q5 are shown as pnp transistors, it will be clear to those skilled in the art that they may be reversed according to the polarity of the power source.

Also, in the embodiment of FIG. 3, resistors R1 and R2 are connected respectively to the bases of the transistors Q1 and Q2. However, as is clear from the foregoing description, resistor R2 is not essential.

Moreover, the current mirror circuit is not limited to that shown in FIG. 3, it being possible to use a generally known current mirror circuit.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. A hysteresis circuit comprising
   a differential amplifier including first and second transistors,
   a first input terminal connected via a resistor to the base of the first transistor,
   a second input terminal connected to the base of the second transistor,
   the emitters of the first and second transistors being connected to one terminal of a first current source,
   a current mirror circuit comprising third and fourth transistors of a complementary type to the first and second transistors connected between the collector of the second transistor and one terminal of a second current source having a current capacity substantially half that of the first current source,
   the other terminals of the first and second current sources being connected together, and
   a fifth transistor of the same type as the third and fourth transistors connected between the collector of the first transistor and a power source terminal with the base of the fifth transistor connected to the one terminal of the second current source.

2. A hysteresis circuit according to claim 1 wherein the first and second transistors are of the npn type and the third, fourth and fifth transistors are of the pnp type.

3. A hysteresis circuit according to claim 1 wherein the second input terminal is connected to ground.

4. A hysteresis circuit according to claim 1 wherein the fourth transistor has a multicollector, one part of which constitutes an output terminal.

5. A hysteresis circuit according to claim 1 wherein the fifth transistor has a multicollector, one part of which constitutes an output terminal.

* * * * *